(12) United States Patent
Yamamoto et al.

(10) Patent No.: US 10,847,207 B2
(45) Date of Patent: Nov. 24, 2020

(54) APPARATUSES AND METHODS FOR CONTROLLING DRIVING SIGNALS IN SEMICONDUCTOR DEVICES

(71) Applicant: Micron Technology, Inc., Boise, ID (US)

(72) Inventors: Nobuo Yamamoto, Tokyo (JP); Takamasa Suzuki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/378,524

(22) Filed: Apr. 8, 2019

(65) Prior Publication Data
US 2020/0321045 A1 Oct. 8, 2020

(51) Int. Cl.
*G11C 7/00* (2006.01)
*G11C 11/408* (2006.01)
*G11C 11/406* (2006.01)

(52) U.S. Cl.
CPC ........ *G11C 11/4085* (2013.01); *G11C 11/406* (2013.01); *G11C 11/4087* (2013.01)

(58) Field of Classification Search
CPC ..... G11C 11/4074; G11C 5/145; G11C 5/147; G11C 11/406; G11C 2211/4061; G11C 2211/4067
USPC ........... 365/189.09, 175, 179, 205, 222, 226
See application file for complete search history.

(56) References Cited

U.S. PATENT DOCUMENTS

| | | |
|---|---|---|
| 6,028,813 A | 2/2000 | Choi |
| 6,178,122 B1 | 1/2001 | Tomishima et al. |
| 6,337,832 B1 | 1/2002 | Ooishi et al. |
| 6,421,295 B1 | 7/2002 | Mao et al. |
| 6,507,532 B1 | 1/2003 | Fujino et al. |
| 7,251,160 B2 | 7/2007 | Li et al. |
| 7,492,640 B2 | 2/2009 | Mokhlesi |
| 7,529,131 B2 | 5/2009 | Iwai et al. |
| 8,358,535 B2 | 1/2013 | Chae et al. |
| 8,395,936 B2 | 3/2013 | Li et al. |
| 8,804,446 B2 | 8/2014 | Okahiro |

(Continued)

FOREIGN PATENT DOCUMENTS

KR 20140136766 A 12/2014

OTHER PUBLICATIONS

U.S. Appl. No. 16/584,746 titled "Apparatuses and Methods for Dynamic Timing of Row Pull Down Operations" filed Sep. 26, 2019, pp. all.

(Continued)

*Primary Examiner* — Thong Q Le
(74) *Attorney, Agent, or Firm* — Dorsey & Whitney LLP

(57) ABSTRACT

Apparatuses and methods for maintaining an active state of a word driver signal are described. The word driver may be included in a memory device including a hierarchical structured main word lines and subword lines. The subword lines may be driven by subword drivers that are activated by main word drivers and word drivers. During an operation such as a refresh operation, a driving signal provided by a word driver to a subword driver may be held in an active state while the driving signal provided by a main word driver to the subword driver transitions between active and inactive states. In some examples, the word driver may include a latch for latching an activation signal at an initiation of a refresh operation to maintain a state of the driving signal.

24 Claims, 8 Drawing Sheets

(56) References Cited

U.S. PATENT DOCUMENTS

| | | |
|---|---|---|
| 8,891,325 B2 | 11/2014 | Choi et al. |
| 8,953,407 B2 | 2/2015 | Yun et al. |
| 9,111,633 B2 | 8/2015 | Kim |
| 9,373,378 B1 | 6/2016 | Chen |
| 9,412,447 B1 | 8/2016 | Bertin et al. |
| 9,418,711 B2 | 8/2016 | Ohgami |
| 9,653,131 B1 | 5/2017 | Yamanaka et al. |
| 9,824,746 B1 | 11/2017 | Lee |
| 9,922,726 B2 | 3/2018 | Choi |
| 10,008,256 B1 | 6/2018 | Kim |
| 10,014,063 B2 | 7/2018 | Tseng et al. |
| 10,347,321 B1 | 7/2019 | Yamanaka et al. |
| 10,490,256 B2 | 11/2019 | Jeong |
| 10,529,400 B1 | 1/2020 | Mahatme et al. |
| 10,614,893 B2 | 4/2020 | Miyazaki |
| 10,636,469 B2 | 4/2020 | El-mansouri et al. |
| 10,650,882 B2 | 5/2020 | Lin et al. |
| 10,665,271 B2 | 5/2020 | Takeda et al. |
| 10,672,443 B2 | 6/2020 | Gupta et al. |
| 10,685,709 B2 | 6/2020 | Tanaka et al. |
| 2002/0001215 A1 | 1/2002 | Fujisawa et al. |
| 2002/0051377 A1 | 5/2002 | Choi et al. |
| 2002/0080677 A1 | 6/2002 | Watanabe et al. |
| 2003/0095438 A1 | 5/2003 | Hosogane |
| 2004/0004899 A1 | 1/2004 | Choi |
| 2004/0052146 A1 | 3/2004 | Sim |
| 2004/0156260 A1 | 8/2004 | Lee |
| 2004/0196719 A1* | 10/2004 | Aritomi ............... G11C 11/406 365/222 |
| 2005/0128858 A1 | 6/2005 | Lee et al. |
| 2005/0226086 A1 | 10/2005 | Sugawara |
| 2006/0158953 A1 | 7/2006 | Takahashi |
| 2006/0176758 A1 | 8/2006 | Chun |
| 2007/0008807 A1 | 1/2007 | Jeong |
| 2007/0030741 A1 | 2/2007 | Nii et al. |
| 2008/0031060 A1 | 2/2008 | Choi et al. |
| 2008/0123463 A1 | 5/2008 | Matsubara |
| 2009/0161418 A1 | 6/2009 | Yoon |
| 2010/0046313 A1 | 2/2010 | Lee et al. |
| 2010/0142306 A1 | 6/2010 | Nakamura et al. |
| 2010/0149900 A1 | 6/2010 | Kitayama |
| 2010/0157716 A1 | 6/2010 | Lee |
| 2011/0199837 A1 | 8/2011 | Reohr et al. |
| 2011/0228624 A1 | 9/2011 | Kim et al. |
| 2012/0120751 A1 | 5/2012 | Okahiro |
| 2012/0147686 A1 | 6/2012 | Takayama et al. |
| 2012/0257437 A1 | 10/2012 | Seko et al. |
| 2012/0287699 A1 | 11/2012 | Yun et al. |
| 2012/0327108 A1 | 12/2012 | Kato et al. |
| 2013/0135915 A1 | 5/2013 | Kim |
| 2013/0215697 A1 | 8/2013 | Choi et al. |
| 2013/0329495 A1 | 12/2013 | Shiino et al. |
| 2014/0369149 A1 | 12/2014 | Park |
| 2015/0098260 A1 | 4/2015 | Ohgami |
| 2015/0364174 A1 | 12/2015 | Ahn et al. |
| 2016/0095178 A1 | 3/2016 | Kuang et al. |
| 2017/0075595 A1 | 3/2017 | Maejima |
| 2017/0178751 A1 | 6/2017 | Choi |
| 2017/0271021 A1 | 9/2017 | Futatsuyama et al. |
| 2017/0278579 A1 | 9/2017 | Lee et al. |
| 2018/0040362 A1 | 2/2018 | Kwak et al. |
| 2018/0074896 A1 | 3/2018 | Takada et al. |
| 2018/0166119 A1 | 6/2018 | Jeong |
| 2018/0277182 A1 | 9/2018 | Inaba |
| 2019/0013055 A1 | 1/2019 | Ohgami |
| 2019/0035466 A1 | 1/2019 | Kim et al. |
| 2019/0088333 A1 | 3/2019 | Shirakawa et al. |
| 2019/0180812 A1 | 6/2019 | Sung et al. |
| 2019/0189186 A1 | 6/2019 | Won et al. |
| 2019/0214293 A1 | 7/2019 | Kim et al. |
| 2019/0385649 A1 | 12/2019 | Kawamura |
| 2020/0027489 A1 | 1/2020 | Choi et al. |
| 2020/0075110 A1 | 3/2020 | Suzuki et al. |
| 2020/0105352 A1 | 4/2020 | Tanzawa |
| 2020/0111517 A1 | 4/2020 | Seo et al. |
| 2020/0143890 A1 | 5/2020 | Lee |
| 2020/0152249 A1 | 5/2020 | Kawamura |
| 2020/0294571 A1 | 9/2020 | Shin |
| 2020/0295021 A1 | 9/2020 | Maejima |

OTHER PUBLICATIONS

U.S. Appl. No. 16/382,856 titled "Apparatuses and Methods for Controlling Word Line Discharge" filed Apr. 12, 2019, pp. all.
U.S. Appl. No. 16/450,696 titled "Apparatuses and Methods for Controlling Word Line Discharge" filed Jun. 24, 2019, pp. all.
U.S. Appl. No. 16/450,723 titled "Apparatuses and Methods for Controlling Word Line Discharge" filed Jun. 24, 2019, pp. all.
U.S. Appl. No. 16/450,737 titled "Apparatuses and Methods for Controlling Word Line Discharge" filed Jun. 24, 2019, pp. all.
U.S. Appl. No. 16/853,417 titled "Apparatuses and Methods for Providing Main Word Line Signal With Dynamic Well" dated Apr. 20, 2020, pp. all.
U.S. Appl. No. 17/038,604 titled "Apparatuses and Methods for Controlling Word Line Discharge" filed Sep. 30, 2020; pp. all.

* cited by examiner

APPARATUSES AND METHODS FOR CONTROLLING DRIVING SIGNALS IN SEMICONDUCTOR DEVICES

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FX) selected by a second portion of the row address.

A memory cell array included in a semiconductor memory device such as the DRAM may be divided into a plurality of memory mats to reduce the wiring capacitance of the subword line and the bit line. The main word line described above is assigned in plurals to one memory mat, so that when the main word line is selected using the first portion of the row address, the memory mat to be selected is also determined at the same time.

The driving process of the subword lines is carried out by subword drivers, and when the subword line is driven to an active potential, the memory cell is connected to the corresponding bit line. On the other hand, during a period in which the subword line is driven to a non-active potential, the memory cell and the bit line are kept in a cut-off state. In driving subword lines to the active potential, relatively high voltages are provided to the subword drivers of a memory mat. In contrast, in driving the subword line to a non-active potential, relatively low voltages are provided to the subword drivers of the memory mat.

During a refresh operation, driving main word lines and word driver lines between the active and inactive states to select subword lines for refreshing memory cells may consume significant current. Reducing current draw during a refresh operation would be desirable to reduce overall power consumption during refresh operations.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FX), which is selected by a second portion of the row address. The MWL may be driven by main word drivers (MWD) and the word driver line FX may be driven by word drivers (FXD). Both the MWL and FX must be driven to active states to select the desired subword line in the memory device. Accordingly, during certain operations, such as refresh operations, one of the MWL or the FX may be held in an active state to reduce current consumption of the memory device in some applications. In other words, a driving signal of the MWL or FX may maintain an active state during a refresh operation.

Figure 1:
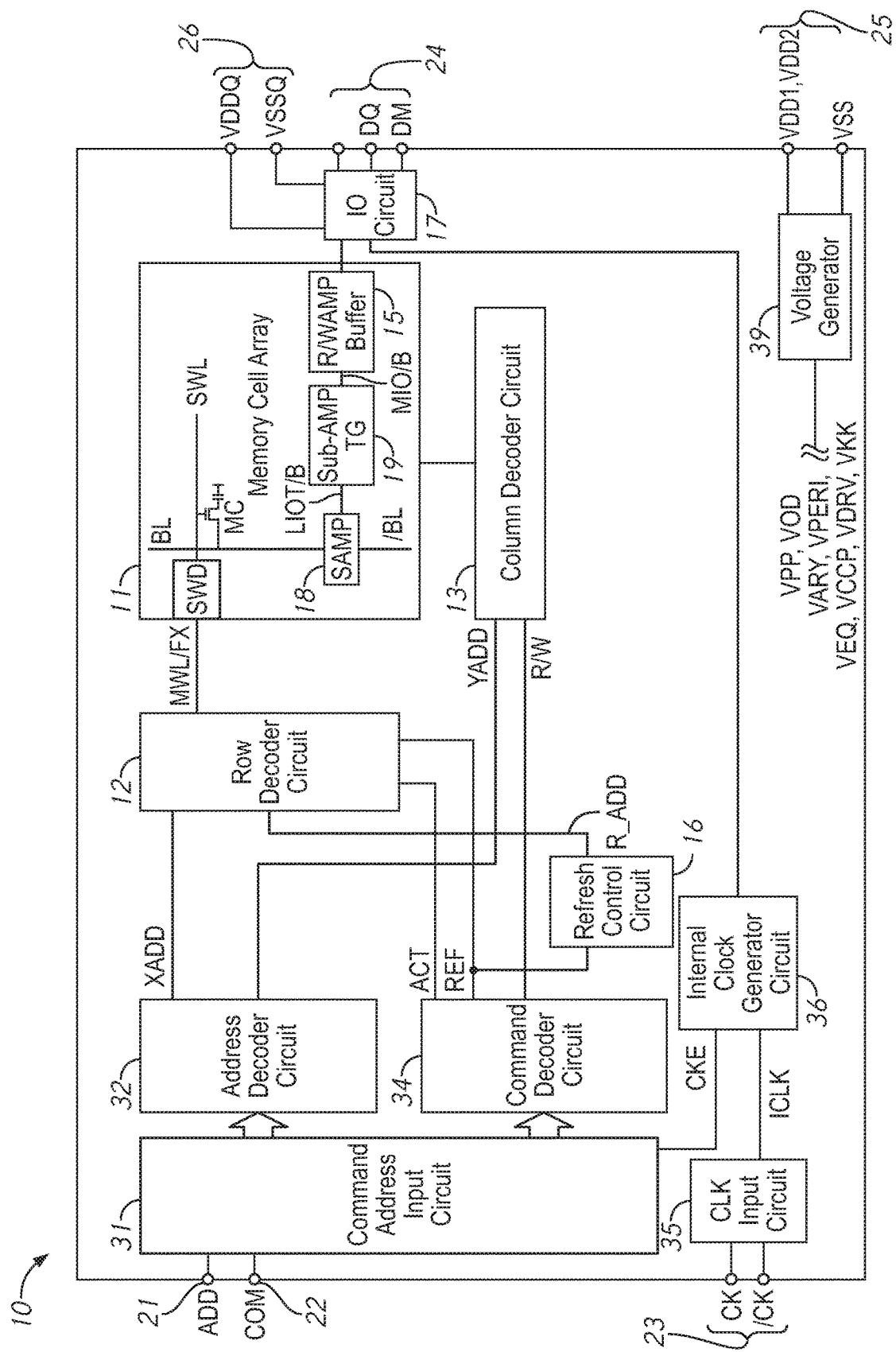
FIG. 1 is a block diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL, SWD, BL, and MC are shown in FIG. 1. The A plurality of main word lines MWL and word driver lines FX are coupled between a row decoder circuit 12 and the SWD. The selection of a main word line MWL and a word driver line FX is carried out by the row decoder circuit 12, and the selection of the bit line BL is carried out by a column decoder circuit 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes address terminals 21, command terminals 22, clock terminals 23, data terminals 24, and power supply terminals 25 and 26.

The address terminals 21 are supplied with an address signal ADD. The address signal ADD is supplied to the address terminals 21 are transferred via a command/address input circuit 31 to an address decoder circuit 32. The address decoder circuit 32 receives the address signal ADD and supplies a decoded row address signal XADD to the row decoder circuit 12, and a decoded column address signal YADD to the column decoder circuit 13.

The command terminals 22 are supplied with a command signal COM. The command signal COM may include one or more separate signals. The command signal COM input to the command terminals 21 is input to a command decoder circuit 34 via the command/address input circuit 31. The command decoder circuit 34 decodes the command signal COM to provide various internal command signals. For example, the internal commands may include a row command signal to select a word line and a column command signal, such as a read command or a write command, to select a bit line.

When a row activation command is issued and a row address is timely supplied with the activation command, and a column address is timely supplied with a read command, read data is read from a memory cell MC in the memory cell array 11 designated by these row address and column address. More specifically, the row decoder circuit 12 selects a main word line MWL, word driver line FX, and subword line SWL indicated by the row address RA indicated by XADD so that the associated memory cell MC is subsequently connected to the bit line BL. The read data DQ is output externally from the data terminals 24 via a read/write amplifier 15 and an input/output circuit 17. Similarly, when the row activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

The device 10 may include a refresh control circuit 16 for carrying out refresh operations. During a refresh operation, memory cells associated with one or more word lines may be refreshed. The refreshing of a word line may be referred to as a refresh, and a refresh operation may include multiple refreshes. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation. As will be described in more detail, a word line (e.g., subword line) indicated by the refresh address R_ADD may be refreshed across multiple memory mats and/or memory banks during a refresh operation.

The clock terminals 23 are supplied with external clock signals CK and/CK, respectively. These external clock signals CK and/CK are complementary to each other and are supplied to a clock input circuit 35. The clock input circuit 35 receives the external clock signals CK and/CK and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is supplied to the input/output circuit 17 and is used as a timing signal for determining an output timing of the read data DQ.

The power supply terminals 25 are supplied with power supply voltages VDD1, VDD2, and VSS. These power supply voltages VDD1, VDD2, and VSS are supplied to an internal voltage generator circuit 39. The internal voltage generator circuit 39 provides various internal voltages VPP, VOD, VARY, VPERI, VEQ, VCCP, VDRV, and VKK.

The internal potentials VCCP, VDRV, and VKK (which may sometimes be used as a non-active potential Gnd) are potentials to be mainly used in the row decoder circuit 12. Although the detailed description thereof will be given later, the row decoder circuit 12 drives the main word line MWL and subword line SWL selected based upon the address signal ADD to a VCCP level corresponding to a high potential (e.g., 3.1 V) so that a cell transistor of the memory cell MC is turned on.

The internal potential VARY and VEQ is a potential to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
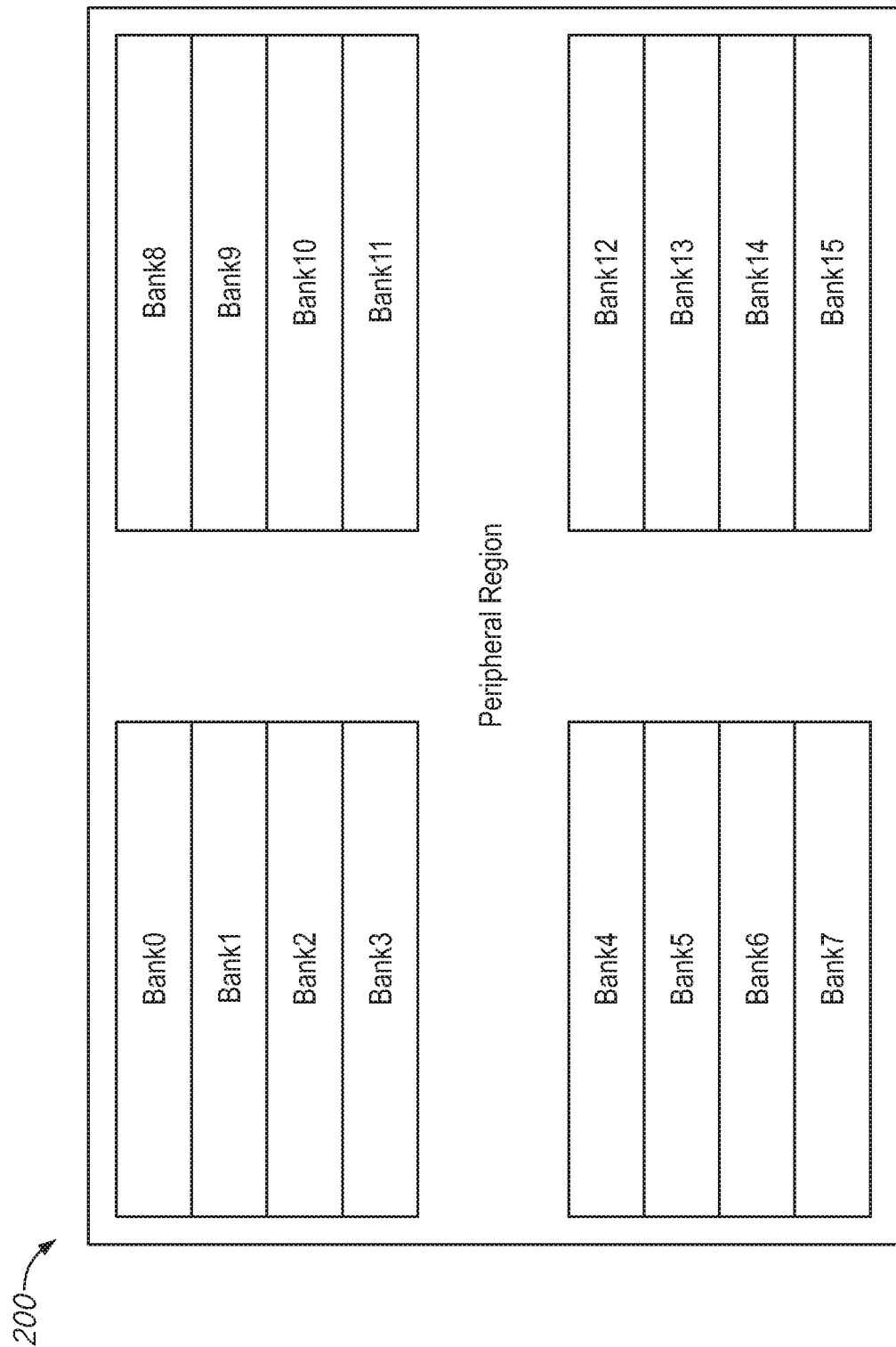
FIG. 2 is a diagram for a layout of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 (FIG. 1).

The memory cell array 200 of the example shown in FIG. 2 is divided into sixteen banks BK0 to BK15. A row decoder circuit (e.g., row decoder circuit 12 of FIG. 1; not shown in FIG. 2) may be disposed between adjacent banks and/or in the peripheral circuit region PE. On the other peripheral circuit region PE, various peripheral circuits and external terminals may be disposed (not shown in FIG. 2).

Figure 3:
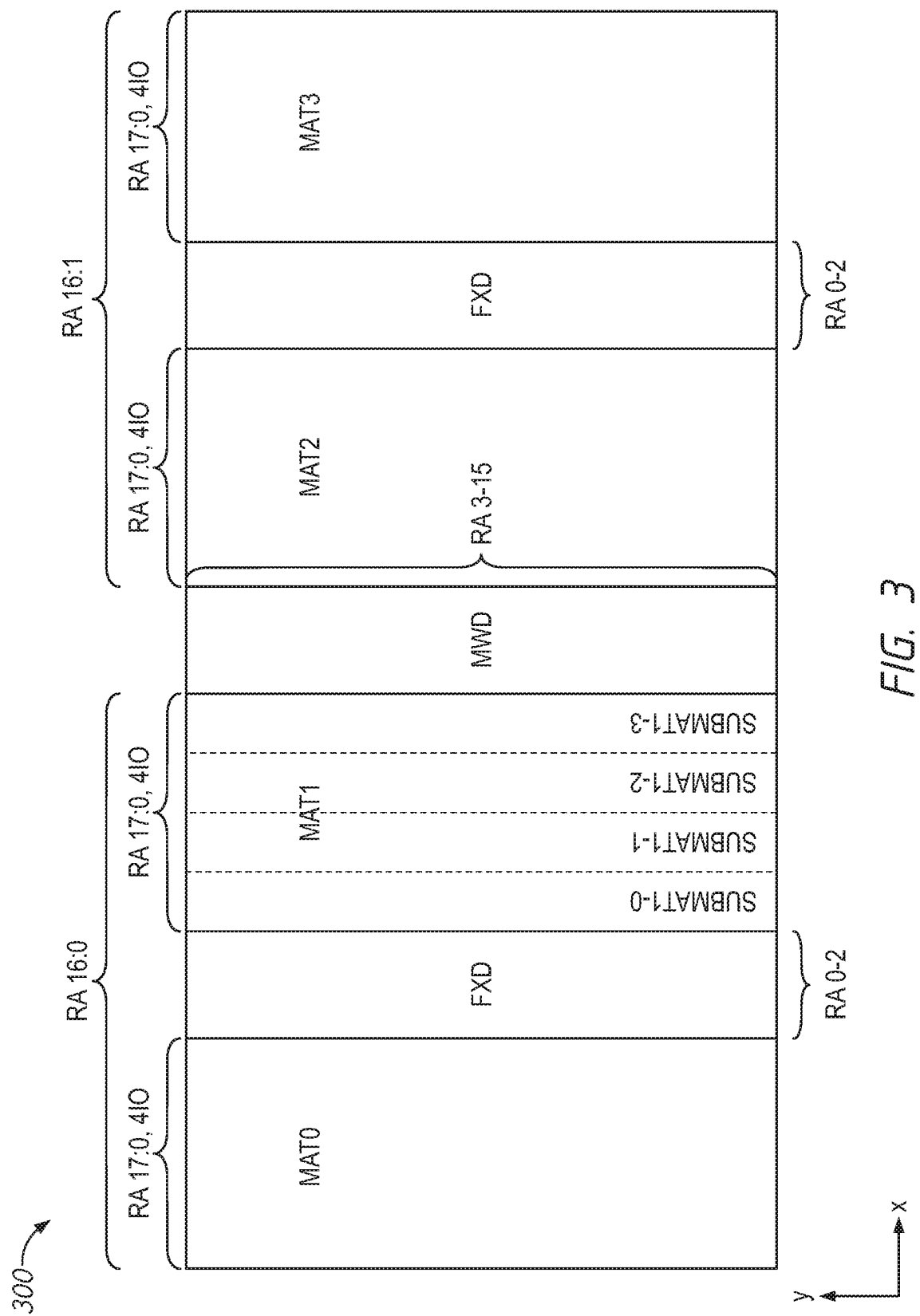
FIG. 3 is a diagram for a configuration of a bank of a memory cell array of a semiconductor device according to an embodiment of the disclosure.

FIG. 3 is a diagram for an example configuration of a bank 300 of a memory cell array according to an embodiment of the disclosure. The banks BK0 to BK15 of FIG. 2 may each include the configuration the bank 300 of FIG. 3 in some embodiments of the disclosure.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub-regions in other examples. Each sub-region SUBMAT1-0-3 may include a plurality of memory mats aligned in the Y-direction (e.g., 64). For clarity, the individual memory mats are not shown in FIG. 3. Not shown in FIG. 3, subword driver rows SWDA may be on the two sides in the X direction of each memory mat, and sense amplifier rows SAA may be on the two sides in the Y direction of each memory mat. The memory mats of each sub-region SUBMAT1-0-3 may be provided to a corresponding IO (e.g., DQ pad) in some embodiments.

The subword driver operations are controlled by a row decoder circuit (not shown in FIG. 3), for example, the row decoder circuit 12 of FIG. 1. When a row address RA is inputted thereto, the row decoder selects a subword line by activating an appropriate main word driver (IIWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWD, each configured to activate a corresponding main word line (MWL). Continuing this example, each word driver F×D block may include eight word drivers FXDs, each configured to activate a corresponding word driver line (FX). In the example shown in FIG. 3, bits 3-15 of the row address RA encode the main word line MWL and bits 0-2 of the row address RA encode the word driver line FX. However, other encoding schemes may be used.

Figure 4:
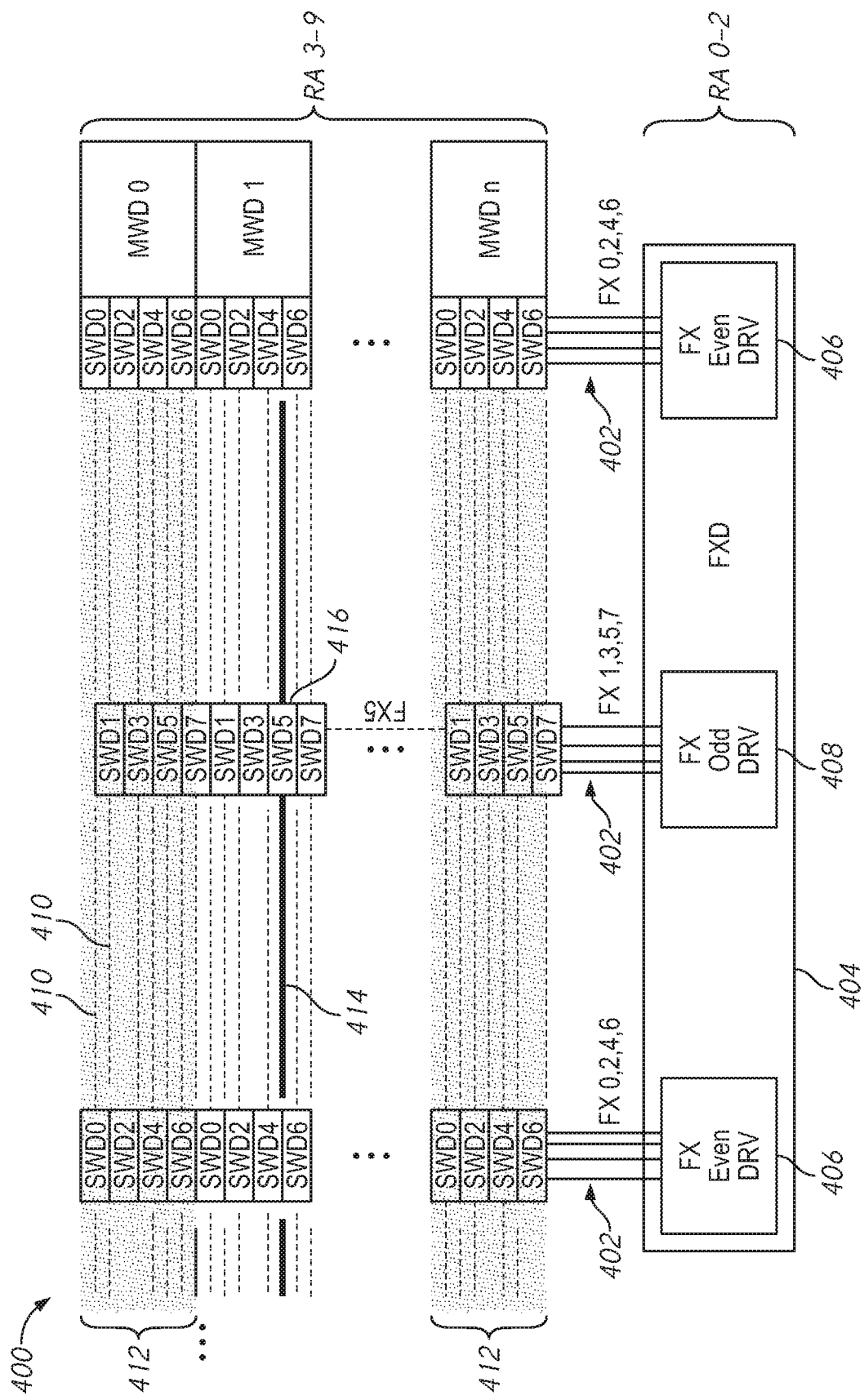
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory array 11 of FIG. 1.

The subword lines are adjacent to each other, and driven by subword drivers SWD0-7 on different subword driver rows. Corresponding main word signals (not shown) driving signals FX and non-active potential VKK/Gnd (not shown) are provided to the subword drivers SWD0-7. The main word signals and the driving signals FX are signals that may be provided by main word drivers MWD0-N and word drivers FXD 404 included with the row decoder 12, based upon the row address RA as described with reference to FIG. 3. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUB-MAT1-0 in FIG. 3) to provide the main word signal to the subword driver rows SWD0-7 of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FX line 5 may be coupled to the subword driver SWD5 of each memory mat.

In the example operation shown in FIG. 4, a row address RA has indicated MWD1 should be activated and odd word driver FXD 408 associated with word driver line FX 5 should be activated. As shown by the shaded regions 412, subword lines 410 associated with the unactivated main word drivers MWD0, MWDn remain inactive, even the subword lines associated with word driver line FX 5. However, the subword line 414 driven by subword driver SWD5 416 associated with activated MWD1 and FX 5 is activated. Thus, a selected subword line SWL of the selected memory mat MAT associated with MWD1 is driven to the active potential by the corresponding activated subword driver SWD5. In some examples, the other subword drivers SWD of the selected memory mat MAT drive the respective unselected subword lines SWL to the non-active potential to remain inactive. Subword drivers SWD of unselected memory mats MAT (e.g., memory mats associated with MWD0 and MWDn) remain deactivated, and the subword lines SWL of the unselected memory mats MAT are not provided a voltage in some examples. That is, in order to be activated, a subword line SWL must be associated with a subword driver SWD coupled to an activated word driver FXD and an activated main word driver MWD.

During a refresh operation, the activation signals to the main word drivers MWD and word drivers FXD may toggle between active and inactive states (e.g., low and high) as different subword lines SWL are refreshed. Thus, the signals provided by the main word drivers MWD and word drivers FXD may also be alternately driven between active an inactive states. Driving both the MWD and the FXD between active and inactive states may increase current draw and power consumption. However, as mentioned, both the MWD and FXD are required to be activated in order to activate a desired SWL. Accordingly, one of the MWD and the FXD may be held in an active state while the other of the MWD and FXD is driven between an active and an inactive state during refreshes of SWLs during the refresh operation. Reducing the number of signals driven between active and inactive states during refresh may reduce current and power consumption. In some applications, holding the word driver FXD in an active state may provide greater power savings because as mentioned previously, each word driver provides two complementary driving signals, FXT and FXF, to each subword driver SWD.

As described herein, a technique for maintaining driving signals FXT and FXF in active states during multiple refreshes of a refresh operation may include assigning the bits of the row address indicating the word driver FXD (e.g., RA0-2 shown in FIGS. 3 and 4) to the most significant bits and assigning the row address bits indicating the main word drivers MWD (e.g., RA3-9, 10-12 shown in FIGS. 3 and 4) to lesser significant bits. During a refresh operation, a refresh control circuit (such as refresh control circuit 16 shown in FIG. 1) may control the row address. For example, the refresh control circuit may increment through row addresses for each refresh performed during a refresh operation to selectively activate and deactivate the main word drivers MWD and word drivers FXD. With this address scheme, driving signals FXT and FXF may remain active while the main word signals provided by the main word drivers MWD may transition between active and inactive states responsive to the refresh control circuit incrementing through the lesser significant bits of the address signal.

Figure 5:
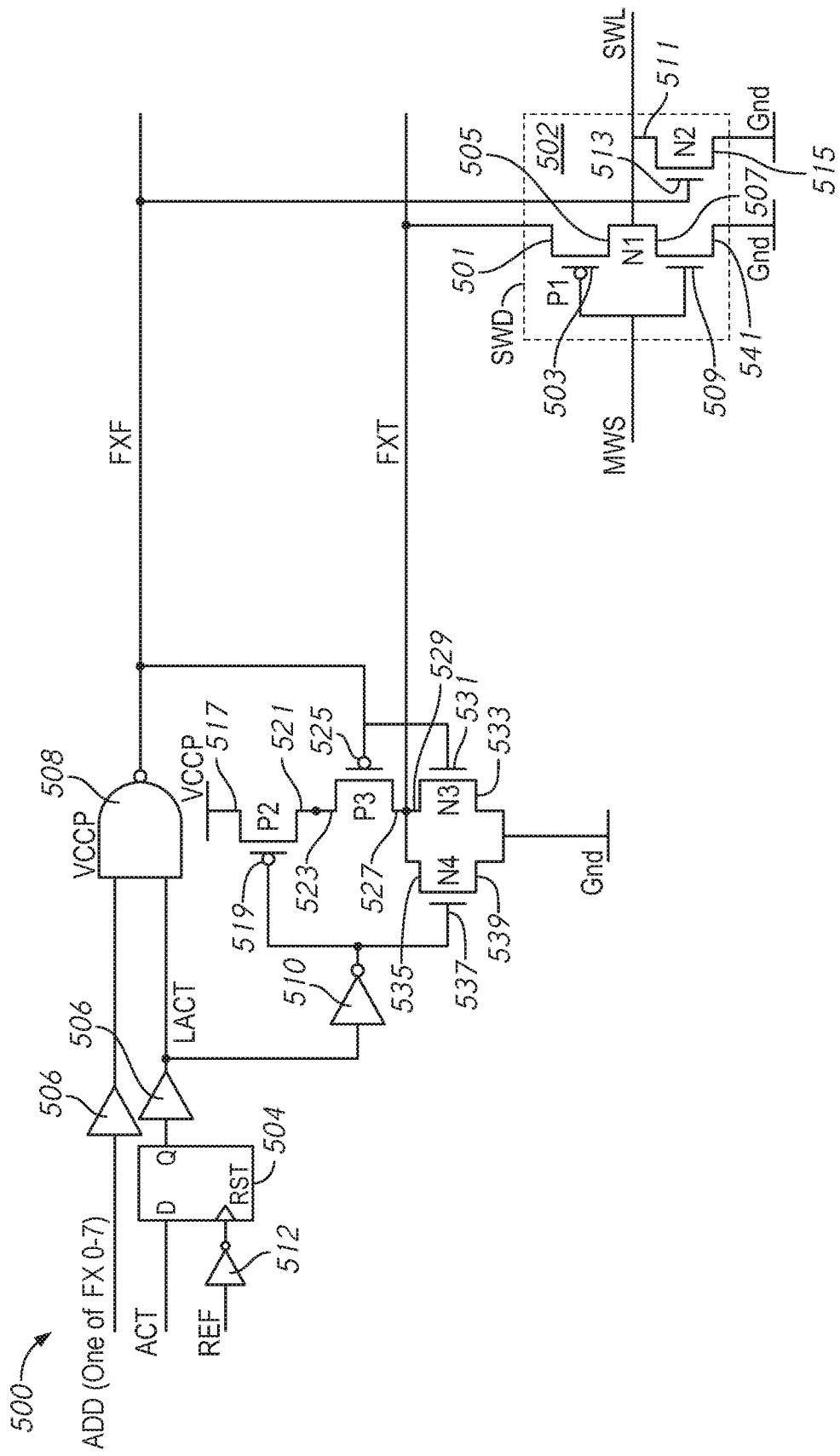
FIG. 5 is a circuit diagram of a word driver according to an embodiment of the disclosure.

FIG. 5 is a circuit diagram of a word driver FXD 500 according to an embodiment of the disclosure. The FXD 500 may be included in word drivers FXD shown in FIG. 3 and/or word driver 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3. For context, a subword driver SWD 502 associated with the FXD 500 is also shown. The SWD 502 may be used to implement the subword drivers SWD0-7 shown in FIG. 4 in some embodiments.

Before explaining the details of the FXD 500, the SWD 502 will be described. In the embodiment shown in FIG. 5, the SWD 502 includes a P-channel type MOS transistor P1 and N-channel type MOS transistors N1 and N2. The transistors P1 and N1 are series-connected to each other at nodes 505 and 507, respectively, and a main word signal MWS is inputted to their gate electrodes (e.g., gate nodes) 503 and 509, respectively. A driving signal FXT is supplied to the node 501 (e.g., drain or source) of the transistor P1, and the non-active potential Gnd is supplied to the node 541 (e.g., drain or source) of the transistor N1. While the examples herein describe the non-active potential as Gnd, other potentials may also be used (e.g., VKK). The nodes (e.g., drains or sources) of the transistors P1 and N1 are connected to subword line SWL. A driving signal FXF is supplied to the gate electrode 513 of the transistor N2, with its node 511 (e.g., drain or source) being connected to the subword line SWL, and the non-active potential Gnd is supplied to its node 515 (e.g., drain or source). As previously described, the main word signal MWS is provided by a main word driver MWD and the driving signals FX and FXF are provided by FXD 500.

The main word signal MWS is a signal that becomes a low level when selected, and the driving signals FXT and FXF are signals that respectively become a high level (e.g., VCCP level) and a low level (e.g., VSS level) when selected. The driving signals FXT and FXF are complementary signals. When the main word signal MWS and the driving signals FXT and FXF are activated (e.g., MWS and FXF are low and FXT is high), transistors N1 and N2 are not activated, but the transistor P1 is activated to provide the FXT signal and the corresponding subword line SWL is driven to the VCCP level that is an active potential. In contrast, when the main word signal MWS is in the inactive state, and either of the driving signals FXT and FXF is also in the inactivated state, the corresponding subword line SWL is driven to the Gnd level that is the non-active potential. While the FXD 500 is shown as providing driving signals FXT and FXF to one subword line driver SWD 502, FXD 500 may provide driving signals to multiple subword drivers, for example, as described in reference to FIGS. 3 and 4.

Returning to the FX driver (e.g., FXD 500), various control signals may be provided to control the operation of the FXD 500. In the example shown in FIG. 5, the FXD 500 receives an address signal ADD, an activation signal ACT, and a refresh signal REF.

The address signal ADD may be provided by an address decoder circuit, such as address decoder circuit 32 shown in FIG. 1 or a refresh control circuit, such as refresh control circuit 16 shown in FIG. 1. As noted in FIGS. 3 and 4, row address bits RA0-2 may be used to indicate one of eight FX drivers (e.g., FX0-7). FXD 500 may be one of the eight FX drivers in some examples. In some embodiments, RA0-2 may be the most significant bits (MSB) of the row address. Accordingly, during certain operations (e.g., refresh operations) where a counter transitions through sequential row addresses, as address bits RA3-9, 10-12 are counted through, the FX driver indicated by RA0-2 remains selected (e.g., address signal ADD remains in an active state). After address bits RA3-9, 10-12 have been counted through, the address bits RA0-2 may be incremented and the address signal ADD may transition to an inactive state to deselect the current FX driver and a different FX driver may be selected.

The activation signal ACT and refresh signal REF may be provided by a command decoder circuit such as command decoder circuit 34 shown in FIG. 1. The activation signal ACT and refresh signal REF may be provided to a latch 504. The latch 504 may be configured to latch a state of the activation signal ACT at the initiation of a refresh operation (e.g., as indicated by an active refresh signal REF) and provide the state of the latched activation signal during the refresh operation. The refresh signal REF is inverted and provided to the latch 504 by inverter 512. The latch 504 may latch a state of the activation signal ACT when the refresh signal REF transitions to an active state. The latched activation signal LACT and the address signal ADD may be provided to level shifters 506 to raise the voltage of the signals to VCCP. In some examples, ADD and LACT may be at 1.2V prior to the level shifter and output at 3.1V from the level shifter. ADD and LACT may be provided as inputs to a NAND gate 508 that outputs driving signal FXF. FXF remains in an inactive state unless both ADD and LACT are high.

FXD 500 may include two P-channel transistors P2 and P3 coupled in series at nodes 521 and 523 respectively, where P3 is further coupled in series at node 527 with an N-channel transistor N3 at node 529. A node 517 of transistor P2 may be coupled to VCCP. FXF is provided to the gate 525 of P3 and gate 531 of N3 and the nodes 527 and 529 of transistors P3 and N3 respectively, are coupled to a word driver line that provides driving signal FXT. The FX driver 500 may further include an N-channel transistor N4 coupled in parallel with transistor N3. The nodes 533 and 539 of transistors N3 and N4 respectively, may be coupled to a non-active potential Gnd. The gate 519 of transistors P2 and gate 537 of N4 may receive an inverted LACT signal from inverter 510.

The FXD 500 may operate such that driving signal FXT is driven to the non-active potential Gnd to an inactive state unless both ADD and LACT are high. That is, a low FXF signal (e.g., in response to active high ADD and LACT signals) activates transistor P3 and deactivates N3 and the inverted LACT signal activates transistor P2 and deactivates transistor N4 such that FXT is driven to VCCP. Thus, if ADD is low (e.g., FXD 500 is no longer indicated by the address RA0-2), FXF and FXT will be inactive, regardless of the state of LACT or REF.

During a refresh operation, the activation signal ACT may toggle between active and inactive states (e.g., low and high) for a plurality of refreshes of subword lines of the memory mats. However, because the latch 504 holds the prior state of the activation signal ACT, FXF is held low and FXT remains high for the duration of the refresh operation. Thus, the driving of the subword line SWL to an active or inactive state by SWD 502 is based on the main word line signal MWS.

Figure 6:
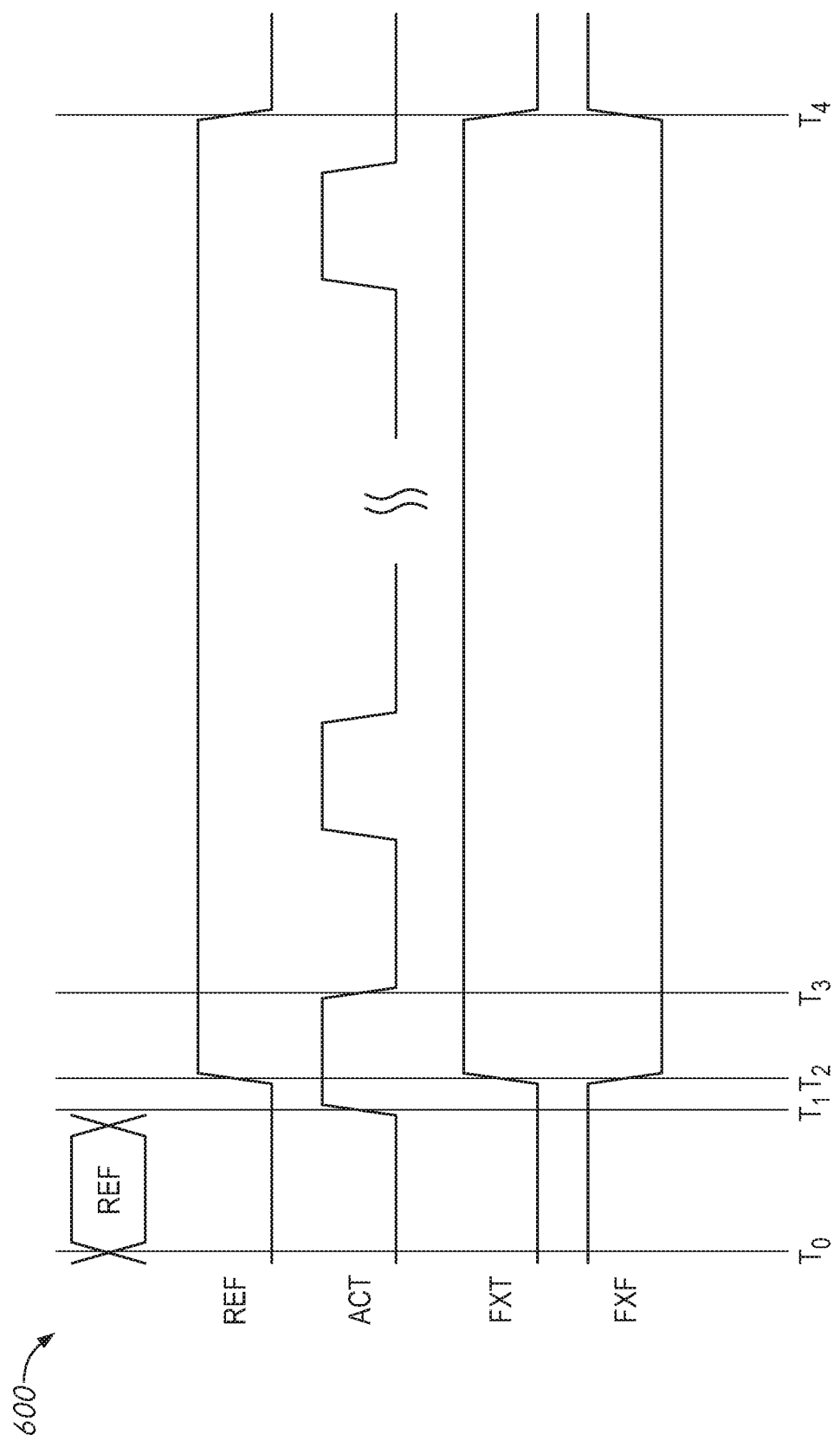
FIG. 6 is a timing diagram of various signals during operation of a driver circuit according to an embodiment of the disclosure.

FIG. 6 is a timing diagram 600 of various signals during a refresh operation of a driver circuit according to an embodiment of the disclosure. In some embodiments of the disclosure, the driver circuit of FIG. 5 may be operated according to the example operation of timing diagram 600. The timing diagram 600 will be described with reference to the driver circuit of FIG. 5.

Around time $T_0$, a refresh command may be received by a device that includes the driver circuit of FIG. 5, for example, the semiconductor device 10 shown in FIG. 1. Around time $T_1$, an activation signal ACT may transition to an active (e.g., high) state indicating active operation of the memory. Responsive to the refresh command, at or around $T_2$, the refresh signal REF transitions to an active (e.g., high) state. The transition to an active refresh signal REF causes the latch 504 to latch the active activation signal ACT and provide a high logic level output. As a result, the LACT signal transitions to a high logic level to activate the transistor P2 and not activate the transistor N4. The high logic level LACT signal also causes the NAND gate 508 to provide an active driving signal FXF (e.g., active low logic level) for those driver circuits provided a high logic level address signal ADD. The active FXF signal activates the transistor P3 and does not activate the transistor N3. The activated transistors P2 and P3 drive the driving signal FXT to VCCP. Transition of the driving signal FXT to VCCP and the FXF signal to an active level are shown in FIG. 6 around time $T_2$. Around time $T_3$, activation signal ACT transitions to an inactive (e.g., low) state as the refresh operation progresses to refresh a different subword line. However, because the word driver FXD 500 latched the state of the activation signal ACT at the initiation of the refresh operation at time T2, FXT and FXF maintain their states for the duration of the refresh operation. Around time T4, when the refresh signal transitions to an inactive (e.g., low) state at the completion of the refresh operation, the inactive activation signal ACT is passed through the latch and provided as a low logic level LACT signal. The low logic level LACT signal deactivates the transistor P2 and activate the transistor N4. The low logic level LACT signal also causes the NAND gate 508 to provide an inactive driving signal FXF that deactivates the transistor P3 and activates transistor N3. The deactivated transistors P2 and P3 stop providing VCCP to the driving signal line and the activated transistors N3 and N4 provide a conductive path for the driving signal line to discharge to the non-active potential Gnd. The transition of the FXF signal and the FXT signal on the driving signal line are shown in FIG. 6 at time T4.

Although not shown, the address signal ADD provided to the driver circuit (e.g., FXD 500) remains in an active state during the refresh operation illustrated in FIG. 6. As mentioned previously, RA0-2 may be the most significant bits (MSB) of the row address. During refresh operations a counter transitions through sequential row addresses as address bits RA3-9, 10-12 are counted through to perform refreshes on subword lines associated with different main word line drivers. During this time, the main word line signal MWS (not shown in FIG. 6), may transition between active and inactive states responsive to the transitioning of address bits RA3-9, 10-12 and/or the activation signal ACT between active and inactive states. In contrast, as shown in FIG. 6, the FX driver indicated by RA0-2 remains selected (e.g., address signal ADD remains in an active state) during the multiple refreshes of the refresh operation. If the address signal ADD became inactive during the refresh operation (e.g., a different word driver was selected to refresh a subword line), both FXT and FXF would be driven to their inactive states (e.g., FXT would go low and FXF would go high) even if REF and ACT were high.

Furthermore, during non-refresh operations (e.g., read, write), FXT and FXF may transition between active and inactive states as ACT transitions between active and inactive states because the latch does not hold a state of the ACT signal during non-refresh operations.

The embodiment of the word driver FXD 500 shown in FIG. 5 may provide current and power savings in a memory device during refresh operations because FXT need not be driven between a high potential (e.g., VCCP) and a low potential (e.g., Gnd, VKK) with every transition of the activation signal ACT as different subword lines are refreshed during a refresh operation. However, maintaining FXT in a high state (e.g., high potential, VCCP) during a refresh operation may cause degradation to one or more P-channel transistors in some applications. For example, FXT is provided to P-channel transistor P1 in the subword driver. When the main word driver associated with the SWD is unselected, one node of the transistor P1 is coupled to a high potential (e.g., 3.1 V) via FXT and the other node is coupled to a non-active potential Gnd. This voltage differential between the nodes of transistor P1 may cause degradation of the P-channel transistor. Accordingly, maintaining FXT at an active state with a lower potential may be desirable in some applications.

Figure 7:
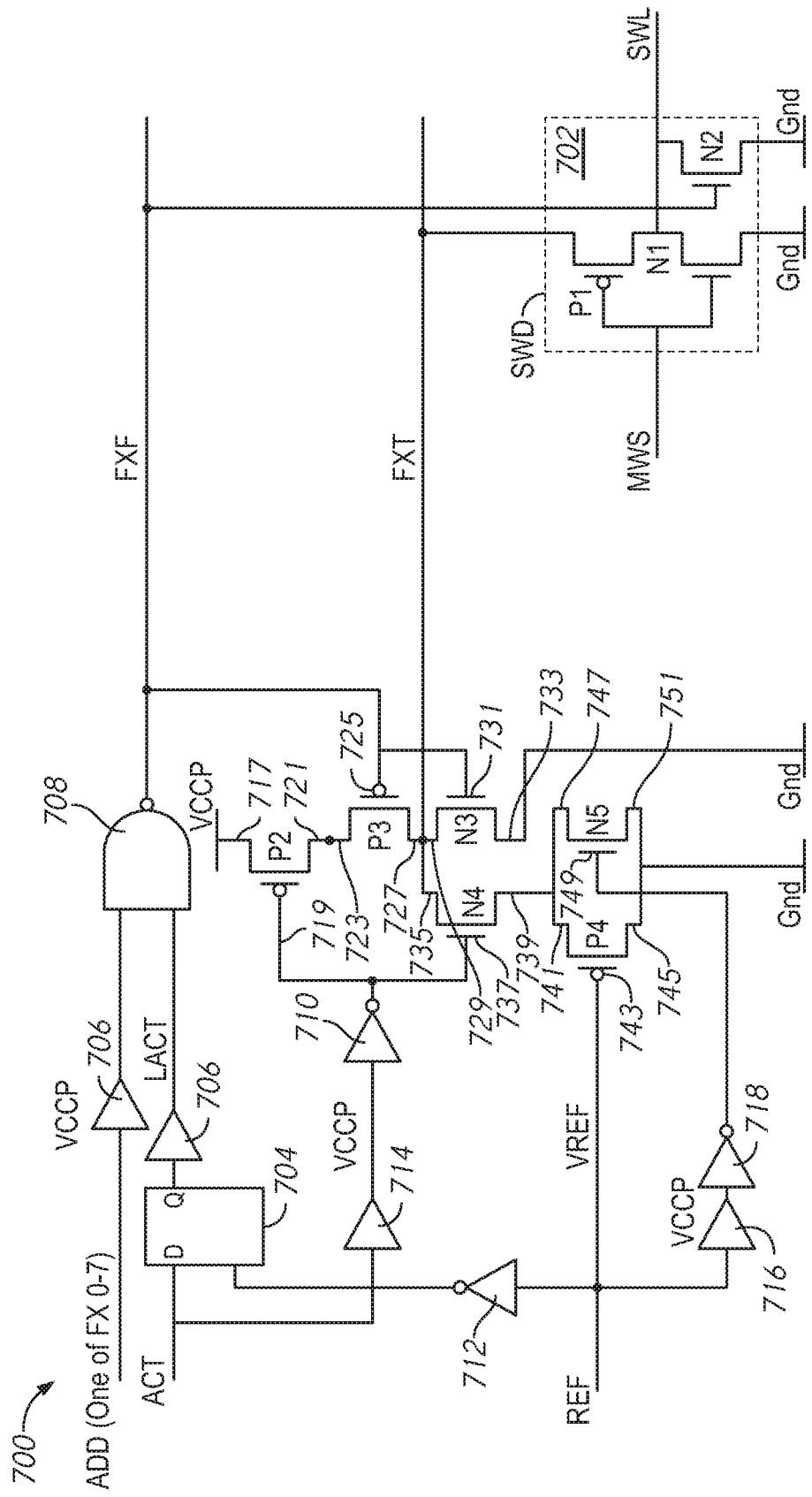
FIG. 7 is a circuit diagram of a word driver according to an embodiment of the disclosure.

FIG. 7 is a circuit diagram of a word driver FXD 700 according to an embodiment of the disclosure. The FXD 700 may be included in word drivers FXD shown in FIG. 3 and/or word driver 404 shown in FIG. 4 in some embodiments. The FXD 700 may be included in a row decoder, such as row decoder 12 in FIG. 1. In some embodiments, FXD 700 may be included in a peripheral region of a memory array, such as memory array 300 shown in FIG. 3. For context, a subword driver SWD 702 associated with the FXD 700 is also shown. The SWD 702 may be used to implement the subword drivers SWD0-7 shown in FIG. 4 in some embodiments.

Various control signals may be provided to control the operation of the FXD 700. In the example shown in FIG. 7, the FXD 700 receives an address signal ADD, an activation signal ACT, and a refresh signal REF. The address signal ADD may be provided by an address decoder circuit, such as address decoder circuit 32 shown in FIG. 1 or a refresh control circuit, such as refresh control circuit 16 shown in FIG. 1. The activation signal ACT and refresh signal REF may be provided by a command decoder circuit such as command decoder circuit 34 shown in FIG. 1. The activation signal ACT and refresh signal REF may be provided to a latch 704. The latch 704 may be configured to latch a state of the activation signal ACT at the initiation of a refresh operation (e.g., as indicated by an active refresh signal REF) and provide the state of the latched activation signal during a refresh operation. The refresh signal REF is inverted and provided to the latch 704 from inverter 712. The latch 704 may latch a state of the activation signal ACT when the refresh signal REF transitions to an active state. The latched activation signal LACT and the address signal ADD may be provided to level shifters 706 to raise the voltage of the signals to VCCP. In some examples, ADD and LACT may be at 1.2V prior to the level shifter and output at 3.1V from the level shifter. ADD and LACT may be provided as inputs to a NAND gate 708 that outputs driving signal FXF. In operation, FXF remains inactive (e.g., high) unless both ADD and LACT are high.

FXD 700 may include two P-channel transistors P2 and P3 coupled in series at nodes 721 and 723, respectively, where P3 is further coupled in series with an N-channel transistor N3 at nodes 727 and 729, respectively. The node 717 (e.g., drain or source) of transistor P2 may be coupled to VCCP. Driving signal FXF is provided to the gate 725 of P3 and gate 731 of N3 and the nodes 727 and 729 (e.g., drains or sources) of transistors P3 and N3 respectively, are coupled to a word driver line that provides driving signal FXT. The node 733 (e.g., drains or sources) of transistor N3 may be coupled to a non-active potential Gnd. The FXD 700 may further include an N-channel transistor N4 coupled in parallel with transistor N3 at nodes 735 and 729, respectively and in series with P-channel transistor P4 at nodes 739 and 741, respectively. The FXD 700 may include N-channel transistor N5 coupled in parallel with transistor P4 at nodes 747 and 741, respectively. Both transistors P4 and N5 may have nodes 745 and 751, respectively coupled to non-active potential Gnd.

The gate 719 of P2 and gate 737 of N4 may receive an inverted activation signal ACT from inverter 710 that has been level shifted to VCCP by level shifter 714. Note that in contrast to the embodiment shown in FIG. 5, transistors P2 and N4 do not receive the latched activation signal LACT. The gate 743 of transistor P4 receives a non-level shifted refresh signal REF and the gate 749 of transistor N5 receives an inverted refresh signal REF from inverter 718 that has been level shifted to VCCP by level shifter 716.

During a refresh operation, when the activation signal ACT goes low when a different subword line is selected, FXF remains low because it receives the latched activation signal LACT, similar to the operation of the word driver FXD 500 shown in FIG. 5. The unlatched inverted inactive activation signal ACT deactivates transistor P2 and activates transistor N4. Here, since REF is high during a refresh operation, transistor N5 is deactivated. In some embodiments, a voltage level of REF may be lower than VCCP (e.g., REF is 1.2V, VCCP is 3.1V), so transistor P4 is active until a voltage level of node 741 is driven from VCCP to $V_{REF}+V_{tp}$. Accordingly, FXT is not brought to Gnd but to a voltage equal to a voltage of the refresh signal $V_{REF}$ plus a threshold voltage $V_{tp}$ of the transistor P4. For example, if the refresh signal REF is provided at 1.2V, then FXT will be driven to $1.2V+V_{tp}$. During the refresh operation FXT may alternate between two active high states, a first at a high potential (e.g., VCCP) and a second at a lower potential (e.g., $V_{REF}+V_{tp}$). Thus, if $V_{REF}+V_{tp}$ is less than VCCP, the voltage difference across transistor P1 is reduced, which may decrease degradation of the transistor P1.

Figure 8:
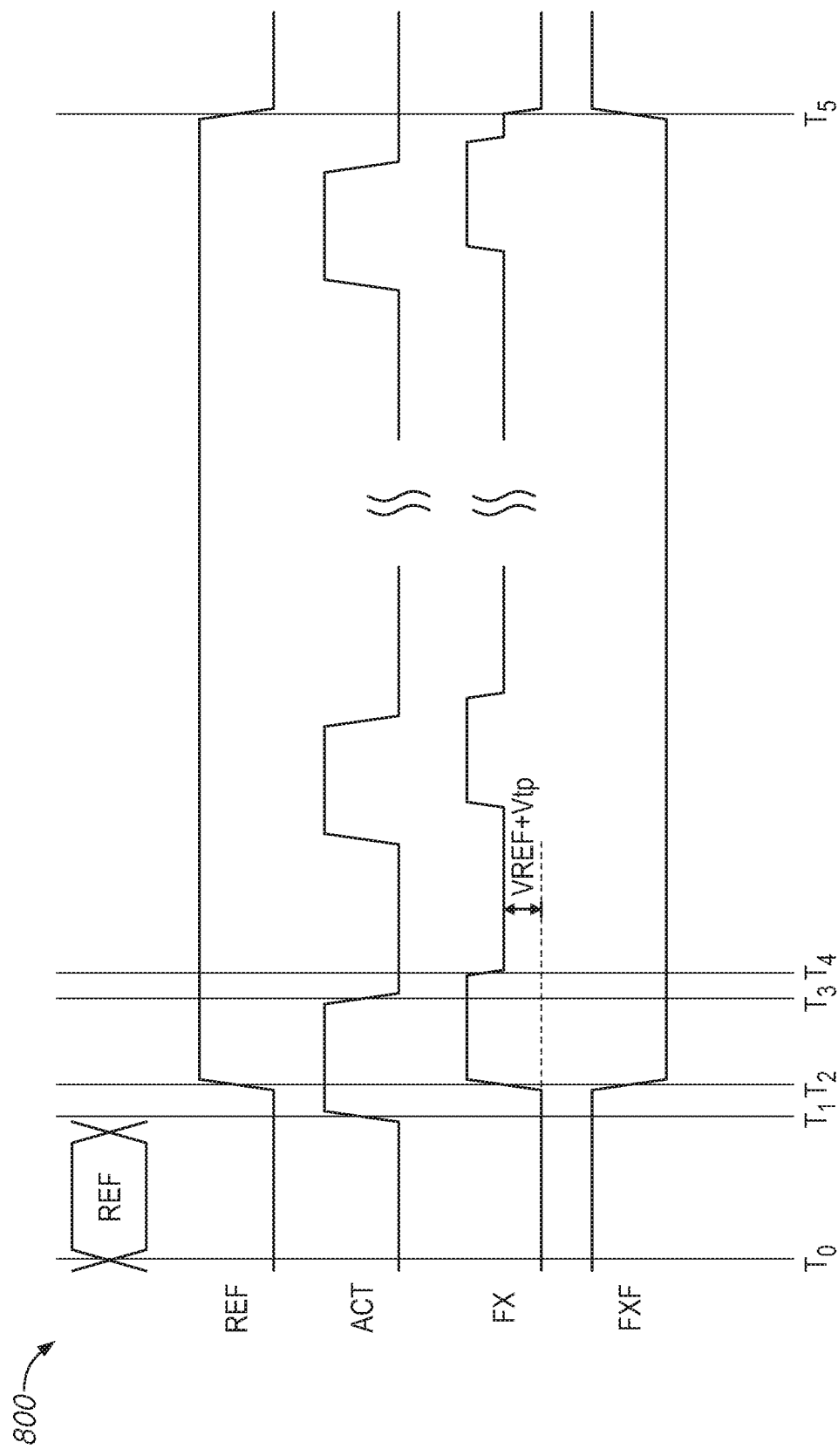
FIG. 8 is a timing diagram of various signals during operation of a driver circuit according to an embodiment of the disclosure.

FIG. 8 is a timing diagram 800 of various signals during a refresh operation of a driver circuit according to an embodiment of the disclosure. In some embodiments of the disclosure, the driver circuit of FIG. 7 may be operated according to the example operation of timing diagram 800. The timing diagram 800 will be described with reference to the driver circuit of FIG. 7.

Around time $T_0$, a refresh command may be received by a device that includes the driver circuit of FIG. 7, for example, the semiconductor device 10 shown in FIG. 1. Around time $T_1$, an activation signal ACT may transition to an active (e.g., high) state indicating active operation of the memory. Responsive to the refresh command, at or around $T_2$, the refresh signal REF transitions to an active (e.g., high) state. The transition to an active refresh signal REF causes the latch 704 to latch the active activation signal ACT and provide a high logic level output. As a result, the LACT signal transitions to a high logic level to cause the NAND gate 708 to provide an active driving signal FXF (e.g., active low logic level) for those driver circuits provided a high logic level address signal ADD. The active FXF signal activates the transistor P3 and does not activate the transistor N3. An unlatched activation signal ACT is provided to inverter 710, the inverted activation signal ACT activates transistor P2 and does not activate transistor N4. The active refresh signal REF does not activate transistor N5. The activation of transistors P2 and P3 drives driving FXT to VCCP, a first active state. Transition of the driving signal FXT to VCCP and the FXF signal to an active level are shown in FIG. 8 around time $T_2$.

Around time $T_3$, activation signal ACT transitions to an inactive (e.g., low) state as the refresh operation progresses to refresh a different subword line. However, because the word driver FXD 700 latched the state of the activation signal ACT prior to the refresh operation, FXF maintains its state for the duration of the refresh operation and transistor P3 remains activated. However, when the activation signal ACT transitions to an inactive state, transistor P2 is not activated and transistor N4 is activated, here, transistor P4 turns on until a voltage level of node 741 is driven from VCCP to $V_{REF}+V_{tp}$. Thus, FXT is drawn from VCCP to a lower level equal to $V_{REF}+V_{tp}$, a second active state. Transition of the driving signal FXT to the second active state is shown in FIG. 8 around time $T_4$. FXT returns to VCCP when the activation signal ACT returns to an active state. Around time $T_5$, when the refresh signal REF transitions to an inactive (e.g., low) state at the completion of the refresh operation, the inactive activation signal ACT does not activate transistor P2 and activates transistor N4. The inactive activation signal ACT passes through the latch 704 as an inactive LACT signal to the NAND gate such that FXF transitions to an inactive (e.g., high) state. The inactive driving signal FXF does not activate transistor P3 and activates transistor N3. The inactive refresh signal REF activates transistors P4 and N5. FXT is driven to an inactive (e.g., low) state.

As described herein, a word driver (e.g., FX driver) may be held in an active state during the refresh operation. Reducing the number of signals driven between active and inactive states may reduce current and power consumption. In some embodiments, the voltage of the active state may be lowered to reduce degradation of one or more transistors of the word driver and/or subword driver.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a plurality of subword lines;
   a plurality of main word drivers configured to drive a plurality of main word lines, respectively;
   a word driver configured to drive a first line;
   a plurality of drive transistors each coupled to a corresponding one of the subword lines at one of a source node or a drain node, a corresponding one of the plurality of main word lines at a gate node, and the first line commonly at the other of the source node or drain node; and
   a refresh control circuit configured to perform a plurality of refreshes by sequentially changing an activated main word line of the plurality of main word lines and maintaining the first line at an active state during changing the activated main word line.

2. The apparatus of claim 1, wherein a drive transistor of the plurality of drive transistors is activated when the corresponding one of the plurality of main word lines is activated by the refresh control circuit and the corresponding one of the subword lines is activated when the first line is at the active state.

3. The apparatus of claim 1, further comprising a command decoder circuit configured to provide an activation signal, wherein the word driver is configured to drive the first line to a first active state responsive to the activation signal in an active state and drive the first line to a second active state responsive to the activation signal in an inactive state during the plurality of refreshes.

4. The apparatus of claim 3, wherein the first active state has a higher potential than the second active state.

5. The apparatus of claim 1, wherein the word driver includes:
an inverter configured to receive a refresh signal from the refresh control circuit and output an inverted refresh signal;
a latch configured to receive an activation signal and the inverted refresh signal and output a latched activation signal, wherein the latch is configured to latch a state of the activation signal responsive to the inverted refresh signal transitioning from a non-active state to an active state;
a NAND gate configured to receive an address signal and the latched activation signal and drive a second line;
a first transistor coupled to a high potential at one of a source node or a drain node;
a second transistor coupled in series with the first transistor;
a third transistor coupled in series with the second transistor and a non-active potential at a second node;
a fourth transistor coupled in parallel with the third transistor and the non-active potential; and
an inverter configured to receive the latched activation signal and provide an inverted latched activation signal to a gate of the first transistor and the fourth transistor,
wherein the first line is driven from between the second transistor and the third transistor and the first line is driven from between the second transistor and the third transistor.

6. The apparatus of claim 1, wherein the word driver includes:
an inverter configured to receive a refresh signal from the refresh control circuit and output an inverted refresh signal;
a latch configured to receive an activation signal and the inverted refresh signal, wherein the latch is configured to output a latched activation signal;
a NAND gate configured to receive an address signal and the latched activation signal and drive a second line;
a first transistor coupled to a high potential at a first node;
a second transistor coupled in series with the first transistor;
a third transistor coupled in series with the second transistor and a non-active potential;
a fourth transistor coupled to one of a source or drain of the second transistor;
a fifth transistor coupled in series with the fourth transistor and the non-active potential;
a sixth transistor coupled in parallel with the fifth transistor and the non-active potential;
a first inverter configured to receive the activation signal and provide an inverted activation signal to a gate of the first transistor and a gate of the fourth transistor;
a second inverter configured to receive the refresh signal and provide a second inverted refresh signal; and a first level shifter configured to shift the second inverted refresh signal from to the high potential and provide a level-shifted inverted refresh signal to a gate of the sixth transistor,
wherein the refresh signal is provided to a gate of the fifth transistor, the second line is provided to a gate of the third transistor and a gate of the third transistor, and the first line is driven from between the second transistor and the third transistor.

7. The apparatus of claim 6, further comprising:
a second level shifter configured to shift the address signal to the high potential;
a third level shifter configured to shift the latched activation signal to the high potential; and
a fourth level shifter configured to shift the activation signal to the high potential.

8. A method comprising:
activating a refresh signal,
sequentially activating and deactivating individual ones of a plurality of main word lines while the refresh signal is active;
activating a first word driver line and maintaining the first word driver line in an active state while the refresh signal is active; and
refreshing individual ones of a plurality of subword lines coupled to the first word driver line and corresponding ones of the plurality of main word lines, wherein the subword lines are refreshed when the corresponding ones of the plurality of main word lines and the first word driver line are active.

9. The method of claim 8, further comprising activating a second word driver line and maintaining the second word driver line in an active state while the refresh signal is active.

10. The method of claim 8, wherein the refresh signal is provided by a refresh control circuit.

11. The method of claim 8, further comprising:
periodically activating and deactivating an activation signal while the refresh signal is active; and
transitioning the first word driver line to a first active state when the activation signal is active and transitioning the first word driver line to a second active state when the activation signal is inactive.

12. The method of claim 11, wherein a potential of the first active state is higher than a potential of the second active state.

13. The method of claim 8, further comprising:
deactivating the refresh signal;
deactivating the first word driver line; and
deactivating the plurality of main word lines.

14. An apparatus, comprising:
a main word driver, which when selected, is configured to activate a main word signal;
a word driver, which when selected, is configured to activate a first signal; and
a subword driver configured to activate a subword signal responsive to the main word signal and the first signal;
wherein the word driver, during a refresh operation, is configured to maintain a voltage level of the first signal at a predetermined voltage for a plurality of refreshes where the word driver remains selected.

15. The apparatus of claim 14, wherein the word driver, during a non-refresh operation, is configured to activate the first signal at a first voltage and inactivate the first signal at a second voltage lower than the first voltage; and
the predetermined voltage is greater than the second voltage.

16. The apparatus of claim 15, wherein the word driver, during the refresh operation, is configured to maintain the first signal at the first voltage during a plurality of refreshes where the word driver remains selected.

17. The apparatus of claim 15, wherein the word driver, during the refresh operation, is configured to drive the first signal between the first voltage and the predetermined voltage, wherein the predetermined voltage is lower than the first voltage, during a plurality of refreshes where the word driver remains selected.

18. The apparatus of claim 15, wherein the word driver, when selected in the non-refresh operation, is configured to activate the first signal responsive to an activated ACT signal and inactivate the first signal responsive to an inactivated ACT signal; and
the word driver, when selected during the refresh operation, is configured to maintain the voltage level of the first signal at the predetermined voltage regardless of the inactivated ACT signal.

19. An apparatus comprising:
a plurality of memory mats each including a plurality of subword lines;
a plurality of subword drivers coupled to respective ones of the plurality of subword lines;
a plurality of main word drivers coupled to respective ones of the plurality of subword drivers, wherein each of the plurality of main word drivers are coupled to the plurality of subword drivers associated with a memory mat of the plurality of memory mats; and
a plurality of word drivers coupled to respective ones of the plurality of subword drivers, wherein each of the plurality of word drivers is coupled to a subword driver of the plurality of subword drivers in each one of the plurality of memory mats, wherein each of the plurality of word drivers is configured to:
provide a first signal a subword driver of the plurality of subword drivers; and
latch a state of an activation signal responsive to a refresh signal transitioning to an active state, wherein the first signal retains an active state for a duration of a refresh operation responsive to the latched state of the activation signal.

20. The apparatus of claim 19, wherein each one of the plurality of word drivers is further configured to provide a second signal to the subword driver of the plurality of subword drivers, the second signal complementary to the first signal, wherein the second signal retains an active state for the duration of the refresh operation.

21. The apparatus of claim 19, wherein each of the plurality of main word drivers are configured to provide a main word signal to a subword driver of the plurality of subword drivers, wherein the main word signal transitions from an active state to an inactive state during the refresh operation.

22. An apparatus comprising:
a plurality of memory mats each including a plurality of subword lines;
a plurality of subword drivers coupled to respective ones of the plurality of subword lines;
a plurality of main word drivers coupled to respective ones of the plurality of subword drivers, wherein each of the plurality of main word drivers are coupled to the plurality of subword drivers associated with a memory mat of the plurality of memory mats; and
a plurality of word drivers coupled to respective ones of the plurality of subword drivers, wherein each of the plurality of word drivers is coupled to a subword driver of the plurality of subword drivers in each one of the plurality of memory mats, wherein each of the plurality of word drivers is configured to:
provide a first signal and a second signal to a subword driver of the plurality of subword drivers, wherein the first signal and second signal are complementary;
latch a state of an activation signal responsive to a refresh signal transitioning to an active state to retain the first signal at an active low state for a duration of a refresh operation; and
transition the second signal between a first active state to a second active state for the duration of the refresh operation responsive to the activation signal.

23. The apparatus of claim 22, wherein the second signal transitions to the first active state when the activation signal transitions to an active state and the second signal transitions to the second active state when the activation signal transitions to an inactive state.

24. The apparatus of claim 22, wherein the first active state is a higher potential than a potential of the second active state.

* * * * *